United States Patent
Morita et al.

Patent Number: 5,914,493
Date of Patent: Jun. 22, 1999

[54] CHARGED-PARTICLE-BEAM EXPOSURE APPARATUS AND METHODS WITH SUBSTRATE-TEMPERATURE CONTROL

[75] Inventors: Kenji Morita, Kawagoe; Teruaki Okino, Kamakura, both of Japan

[73] Assignee: Nikon Corporation, Tokyo, Japan

[21] Appl. No.: 09/028,171

[22] Filed: Feb. 23, 1998

[30] Foreign Application Priority Data

Feb. 21, 1997 [JP] Japan .................................. 9-037263
Apr. 3, 1997 [JP] Japan .................................. 9-085156
Jul. 8, 1997 [JP] Japan .................................. 9-196406

[51] Int. Cl.$^6$ .................................................. H01L 21/00
[52] U.S. Cl. ...................................... 250/492.2; 250/443.1
[58] Field of Search .............................. 250/492.2, 492.1, 250/492.3, 441.11, 442.11, 443.1

[56] References Cited

U.S. PATENT DOCUMENTS 4,911,103  3/1990  Davis et al. ........................ 250/441.11

FOREIGN PATENT DOCUMENTS 90-002111  1/1990  Japan .
92-304617  10/1992  Japan .

Primary Examiner—Kiet T. Nguyen
Attorney, Agent, or Firm—Klarquist Sparkman Campbell Leigh & Whinston, LLP

[57] ABSTRACT

Apparatus and methods are disclosed for increasing the throughput of a charged-particle-beam exposure apparatus. The apparatus comprises an exposure-processing chamber in which exposure of individual sensitive substrates is performed using a charged-particle beam under preset vacuum and temperature conditions. A load-lock chamber, connected to the exposure-processing chamber by a gate valve, is used to bring the sensitive substrate from atmospheric conditions to a vacuum condition in preparation for transport into the exposure-processing chamber. Means are provided for adjusting the temperature of the sensitive substrates so that, upon entry of the sensitive substrate into the exposure-processing chamber, the temperature of the sensitive substrate matches an interior temperature of the exposure-processing chamber.

15 Claims, 6 Drawing Sheets

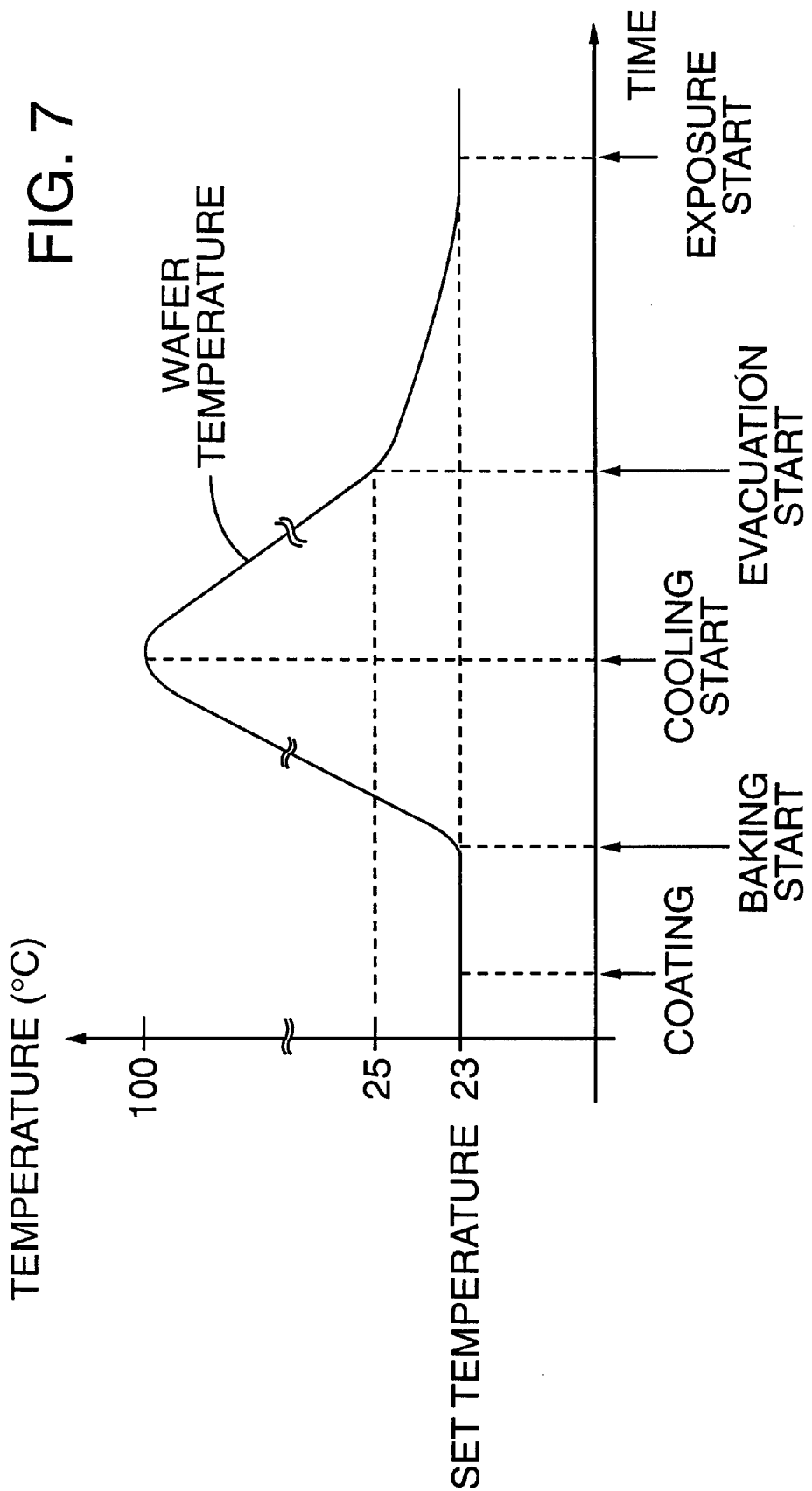

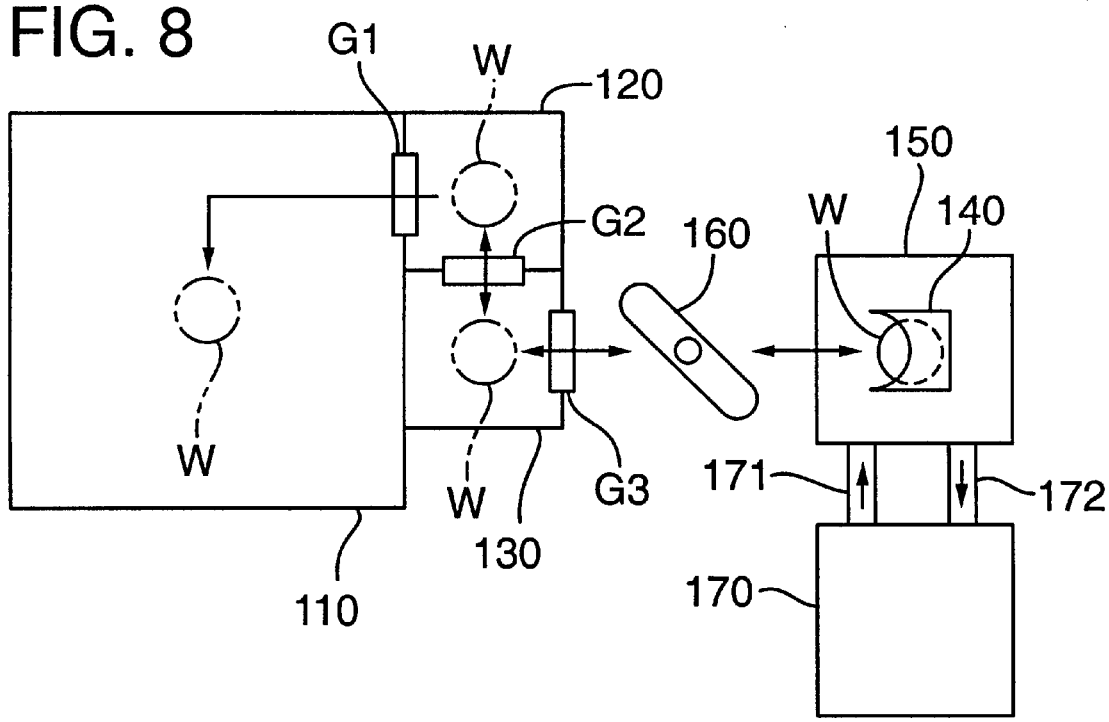
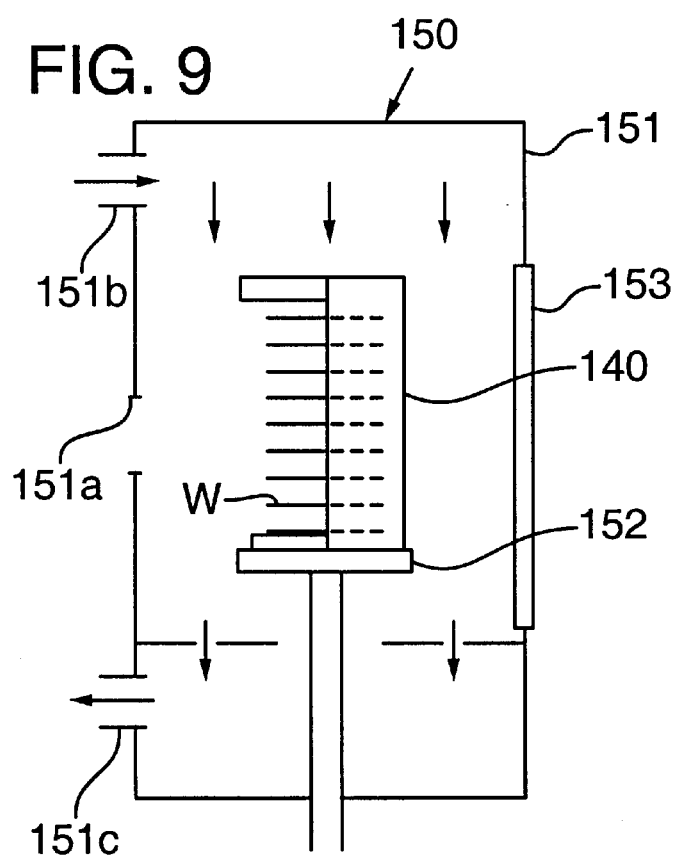

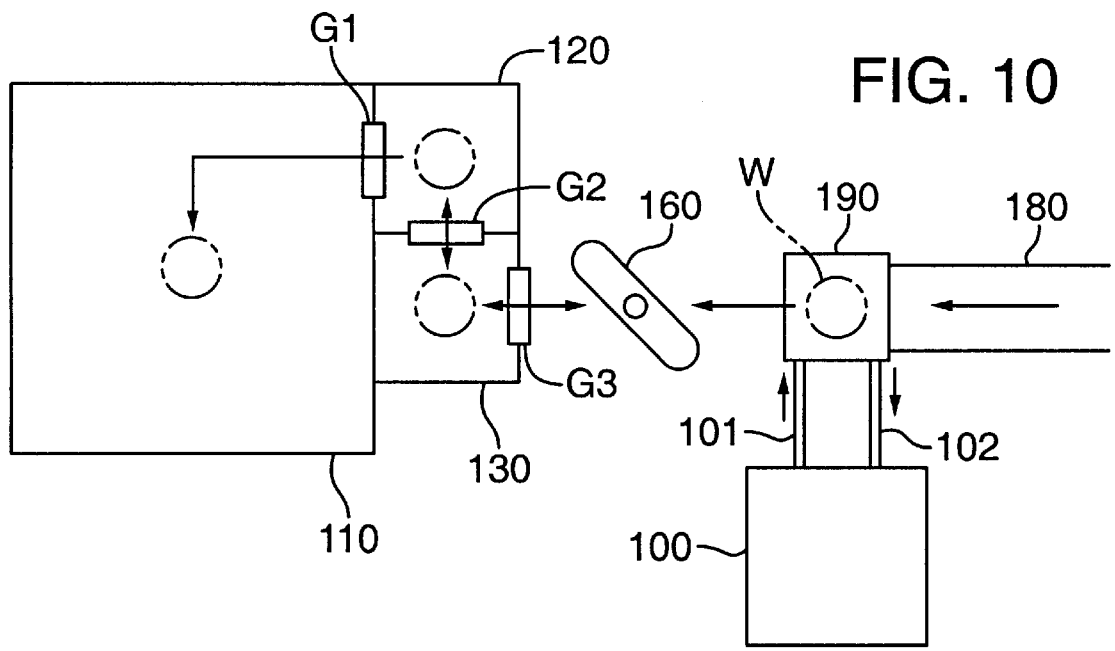
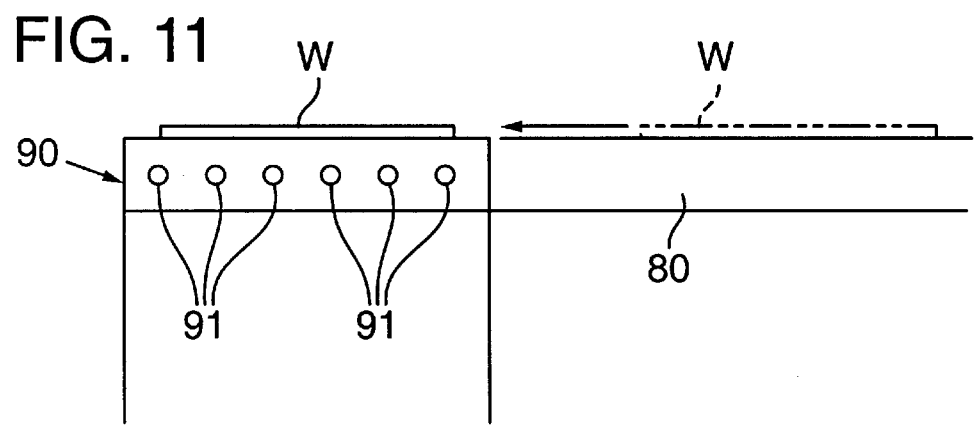

CHARGED-PARTICLE-BEAM EXPOSURE APPARATUS AND METHODS WITH SUBSTRATE-TEMPERATURE CONTROL

FIELD OF THE INVENTION

This invention pertains to charged-particle-beam exposure apparatus used in micro lithography for the production of semiconductor devices, including integrated circuits and displays. In particular, this invention pertains to charged-particle-beam exposure apparatus that control the temperature of sensitive substrates prior to exposure processing to increase throughput.

BACKGROUND OF THE INVENTION

Charged-particle beams such as electron beams or ion beams have recently been considered for use in lithography exposure processes for producing sub-micron level semiconductor integrated circuits. FIG. 4 is a schematic diagram depicting a structural configuration and processing sequence of a conventional charged-particle-beam (CPB) exposure apparatus. The CPB exposure apparatus of FIG. 4 includes an exposure-processing chamber 1, a load-lock chamber 3, and an atmospheric chamber 8. The exposure-processing chamber 1 is connected to the load-lock chamber 3 by a first gate valve 2, and the load-lock chamber 3 is connected to the atmospheric chamber 8 by a second gate valve 5. Multiple wafers 6 are stored in a wafer holder 7.

As used herein, the term "wafer" encompasses any sensitive substrate suitable for use in CPB exposure apparatus, such as silicon wafers for semiconductor manufacture, glass plates for liquid crystal displays, and analogous structures.

CPB exposure processing requires that the exposure-processing chamber 1 be maintained under a constant vacuum condition (e.g., $10^{-6}$ Torr). It is therefore necessary to bring each wafer 6 from an atmospheric condition to such a vacuum condition prior to exposure processing in the exposure-processing chamber 1. This is accomplished by the following transport operations. The first gate valve 2 is closed and the second gate valve 5 is opened to bring the load-lock chamber 3 to atmospheric pressure. One of several wafers 6, located at position D in the atmospheric chamber 8, is transported to position C and then to position B in the load-lock chamber 3. The second gate valve 5 is then closed and the load-lock chamber 3 is rapidly evacuated until the pressure inside of the load-lock chamber 3 matches the vacuum condition in the exposure-processing chamber 1. The first gate valve 2 is then opened and the wafer 6 is transported from position B to position A in the exposure-processing chamber 1. The first gate valve 2 is closed, and exposure processing begins in the exposure-processing chamber 1. Meanwhile, the load-lock chamber 3 is returned to atmospheric pressure and another wafer 6 is transported sequentially through positions D-C-B, whereupon the load-lock chamber 3 is evacuated again.

When exposure processing of a wafer 6 is completed, the first gate valve 2 is opened and the processed wafer 6 is removed from the exposure-processing chamber 1 to position E in the load-lock chamber 3, while the unprocessed wafer 6 at position B is transported to position A. The wafer 6 at position E is then transported to position D via position F after the load-lock chamber 3 is returned to atmospheric pressure.

The above transport and exposure processing operations are repeated on multiple respective wafers 6.

When the load-lock chamber 3 is rapidly evacuated the temperature of the gas remaining in the load-lock chamber decreases due to adiabatic expansion. This reduced-temperature gas typically cools the wafer 6 by approximately 2–3° C., causing the wafer 6 to contract. In the case of an 8-inch silicon wafer, the overall diameter of the wafer typically decreases by approximately 0.5 μm per °C. of temperature decrease. If exposure patterns are made on an 8-inch silicon wafer while the temperature of the wafer is different than the operating temperature of the exposure-processing chamber 1, the position of the exposure patterns made in peripheral regions of the wafer will be in error by approximately 0.25 μm per °C. of temperature difference (when compared with an exposure pattern made on an 8-inch silicon wafer that is at the operating temperature throughout exposure). This level of positional error is several orders of magnitude too high for high-level integration semiconductor manufacturing. In order to stay within the desired positional-error limit of 10 nm or less, the wafer temperature must be maintained within ±0.02° C. of the operating temperature of the exposure-processing chamber 1.

When the wafer 6 is first transported into the exposure-processing chamber 1, the wafer temperature is less than the operating temperature of the exposure-processing chamber 1, causing the wafer temperature to slowly increase. Exposure processing of the wafer 6 should not be initiated until the temperature of the entire surface of the wafer 6 has stabilized. In the foregoing example of an 8-inch silicon wafer, temperature stabilization may require ten or more minutes per wafer. Such waiting times of this magnitude are intolerable—modern semiconductor manufacturing processes are expected to provide throughput levels of 30–60 wafers/hour, i.e., one wafer every 1–2 minutes. Therefore, the waiting time per wafer must be minimized to achieve such an expected throughput.

SUMMARY OF THE INVENTION

In view of the foregoing shortcomings of conventional apparatus and methods, an object of this invention is to provide a charged-particle-beam (CPB) exposure apparatus exhibiting higher throughput by minimizing the time required for the wafer temperature to stabilize after the wafer has been transported into the exposure-processing chamber. The invention is exemplified by several apparatus embodiments that accomplish this objective by controllably adjusting the temperature of the wafer so that the wafer temperature upon entering the exposure-processing chamber matches the operating temperature of the exposure-processing chamber.

According to one aspect of the invention, CPB exposure apparatus are provided, each comprising an exposure-processing chamber where exposure of sensitive substrates ("wafers" as defined above) is performed using a charged-particle beam under preset vacuum and temperature conditions. A preferred embodiment of the apparatus comprises a load-lock chamber, the pressure of which can be varied between atmospheric and a suitable vacuum, and a gate valve that connects the load-lock chamber to the exposure-processing chamber. The apparatus also comprises transport means for transporting wafers from an external environment to the load-lock chamber, and transporting the wafers from the load-lock chamber to the exposure-processing chamber. The apparatus further comprises means for adjusting the temperature of the wafers prior to exposure processing in the exposure-processing chamber.

The wafers are transported into the load-lock chamber under atmospheric conditions, whereupon the load-lock chamber is evacuated so that the vacuum in the load-lock chamber matches the vacuum in the exposure-processing chamber. Upon completion of this evacuation, a wafer is transported through the gate valve into the exposure-processing chamber.

During evacuation of the load-lock chamber, the gas remaining in the load-lock chamber undergoes an adiabatic expansion, which cools the gas. This cooled gas reduces the temperature of the wafer. Means for adjusting the temperature of the wafer prior to and/or during the evacuation are employed to compensate for the heat loss due to the adiabatic expansion and other heat losses during transport so that the temperature of the wafer upon entry into the exposure-processing chamber preferably matches an interior temperature of the exposure-processing chamber.

According to a first representative embodiment, the load-lock chamber can comprise a temperature-controlled wafer holder that is heated by a first and/or second heating mechanism. The first heating mechanism heats the specimen holder preferably by circulating a temperature-controlled liquid or gas through the wafer holder. The second heating mechanism preferably comprises a lamp heater or a nichrome heater that primarily heats the wafer holder by radiation. The wafer holder is preferably made from ceramic, and preferably has a planer top surface. The top surface preferably comprises a thin metal film layer with a thin insulator thereon, wherein a dc voltage is applied to the thin metal film layer to electrostatically hold a wafer, thereby increasing the contact pressure between the top surface and the wafer.

According to a second representative embodiment, the CPB exposure apparatus can comprise a coater, a baking chamber, and a cooling chamber, sequentially connected to each other. The coater is used to apply a resist to the wafer. The baking chamber bakes the wafer to evaporate any solvent in the resist. The cooling chamber cools the wafer. Inside the cooling chamber is a temperature-controlled metal plate, which is used to adjust the temperature of the wafer.

According to a third representative embodiment, the means for adjusting wafer temperature can comprise an isothermal tank that preferably heats the wafers to a preset temperature by circulating temperature-controlled air or other suitable gas over the wafers.

According to a fourth representative embodiment, the means for adjusting wafer temperature can comprise an isothermal plate, preferably heated by water or other suitable fluid.

In any of various embodiment, the CPB exposure apparatus can comprise a loader chamber, situated between the load-lock chamber and the exposure-processing chamber. In such a configuration, the load-lock chamber is connected to the loader chamber by a first gate valve, and the loader chamber is connected to the exposure-processing chamber by a second gate valve.

The foregoing and additional features and advantages of the invention will be more readily apparent from the following detailed description, which proceeds with reference to the accompanying drawings.

BRIEF DESCRIPTION OF THE DRAWINGS

FIG. 7 is a wafer-temperature transition graph that shows the temperature of a wafer during pre-exposure operations.

FIG. 8 is a block schematic diagram showing a third example embodiment of a CPB exposure apparatus according to the invention.

FIG. 9 is a schematic drawing showing the interior of the isothermal tank of the FIG. 8 embodiment.

FIG. 10 is a block schematic diagram showing a fourth example embodiment of a CPB exposure apparatus according to the invention.

FIG. 11 is a schematic drawing of the isothermal plate of the FIG. 10 embodiment.

DETAILED DESCRIPTION

This invention is described below in connection with multiple example embodiments that represent the current best mode of the invention.

Example Embodiment 1

Figure 1:
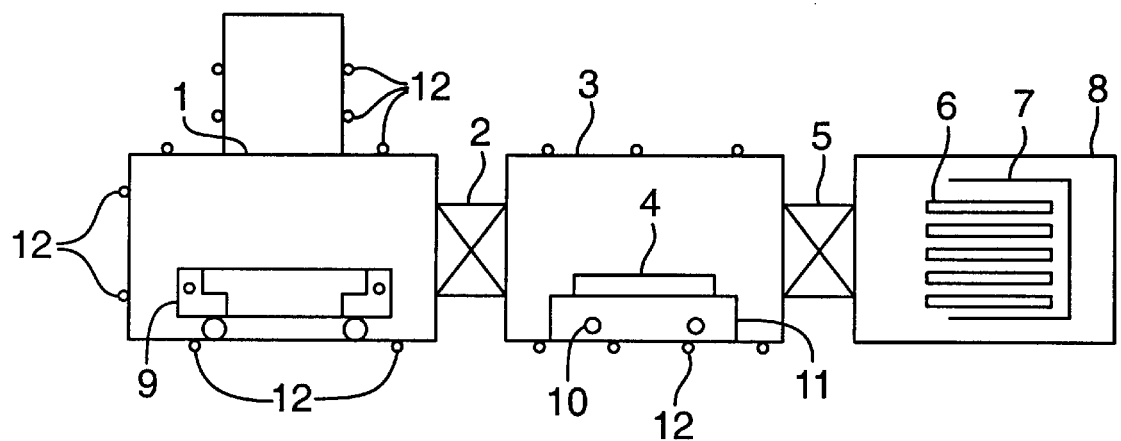
FIG. 1 is a block schematic diagram showing a first example embodiment of a charged-particle-beam (CPB) exposure apparatus according to the invention.
Figure 4:
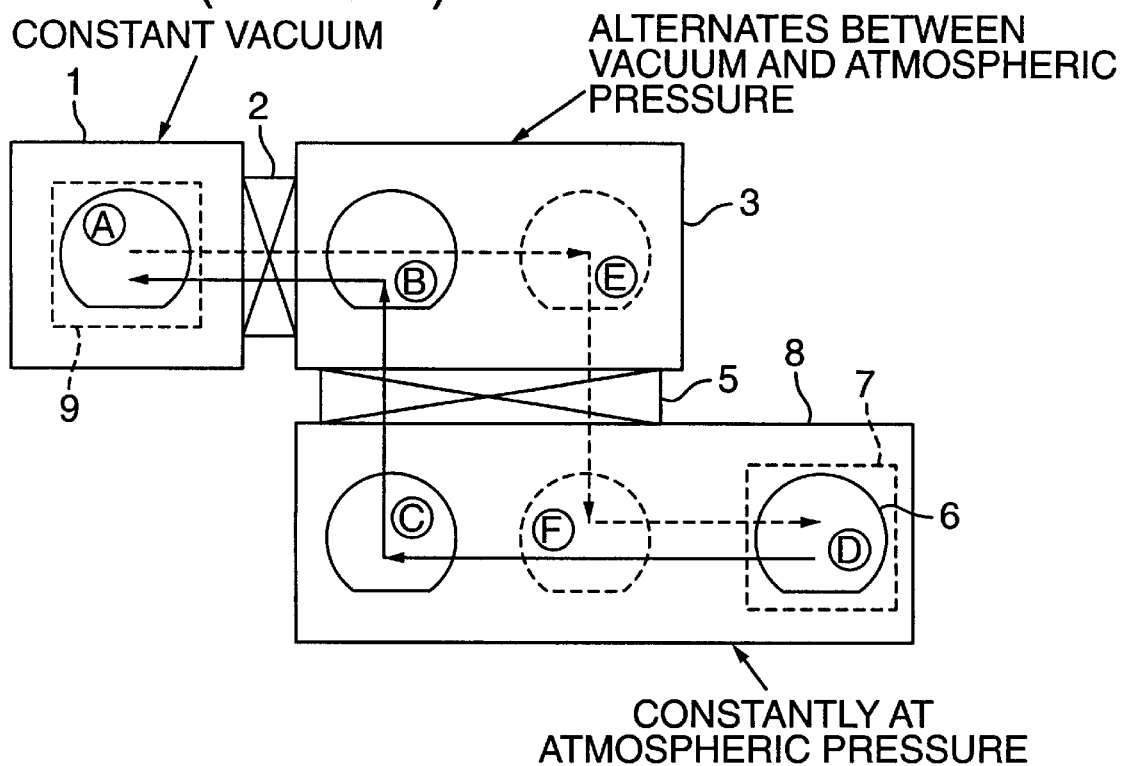
FIG. 4 is a schematic block diagram showing a sequence by which wafers are transported in a conventional CPB exposure apparatus.

FIG. 1 is a block schematic diagram showing a first example embodiment of a charged-particle-beam (CPB) exposure apparatus according to the invention. This example embodiment comprises an exposure-processing chamber 1, a load-lock chamber 3, and an atmospheric chamber 8. The exposure-processing chamber 1 is connected to the load-lock chamber 2 by a first gate valve 2, and the load-lock chamber 3 is connected to the atmospheric chamber 8 by a second gate valve 5. It will be understood that the exposure-processing chamber 1 comprises an electron gun, an electron-beam projection-optical system, deflectors, a wafer stage 9, and interferometers that measure the XY coordinate position of the wafer stage 9 (all not shown except for the wafer stage 9). The wafer-transport sequence for this example embodiment is similar to that shown in FIG. 4 and discussed above.

The entire CPB exposure apparatus is kept at a constant temperature by circulating a temperature-controlled coolant around the outside of the apparatus through flow conduits 12. The temperature (of the entire apparatus) is generally set to match the temperature of the surrounding clean room (approximately 23° C.). The exposure-processing chamber 1 is maintained under a constant vacuum condition (e.g, $10^{-6}$ Torr).

Multiple wafers 6 are stored in a wafer holder 7 located in the atmospheric chamber 8. Individual wafers 6 are transported from the atmospheric chamber 8 to the load-lock chamber 3 using a commonly known transport mechanism, such as a transport arm, etc. The wafer 6 is placed on a holder table 4 in the load-lock chamber 3. The second gate valve 5 is then closed and evacuation of the load-lock chamber 3 by a vacuum pump (not shown) begins. When the specified vacuum level (equal to the vacuum level in the adjacent exposure-processing chamber 1) in the load-lock chamber 3 is reached, the first gate valve 2 is opened, and the wafer 6 is transported to the wafer stage 9 in the exposure-processing chamber 1.

Figure 2:
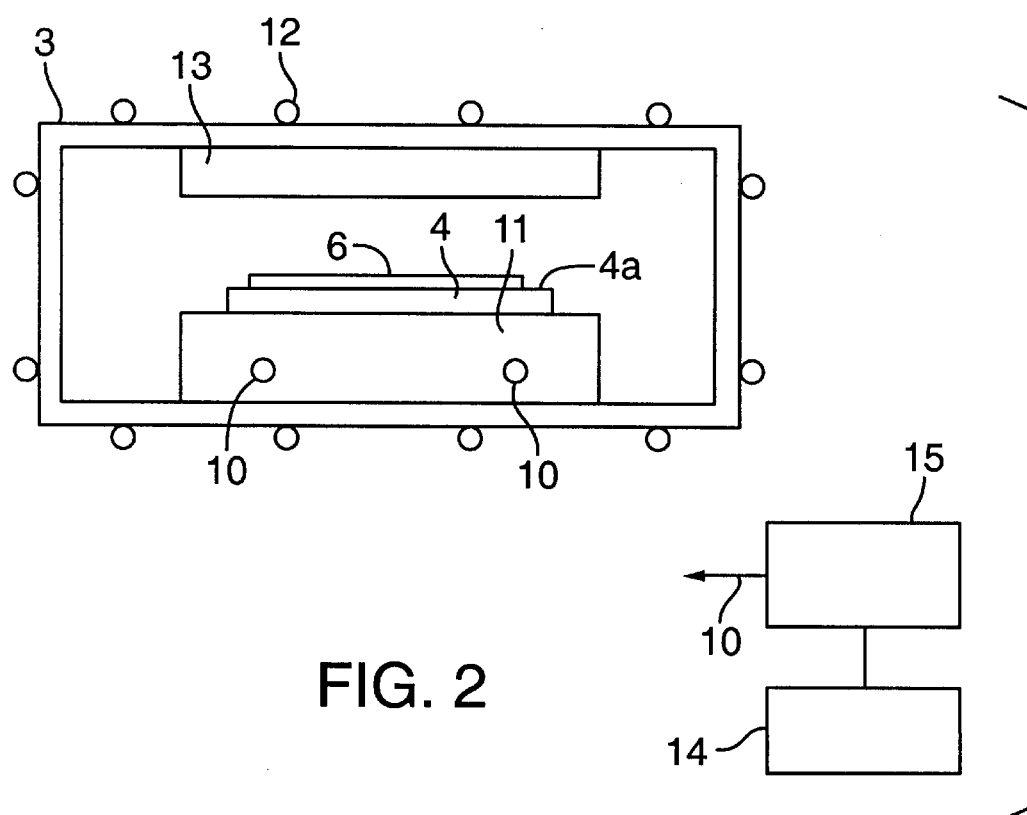
FIG. 2 is a detailed schematic drawing of the load-lock chamber of the FIG. 1 embodiment.

The construction of the load-lock chamber 3 is shown in FIG. 2. The load-lock chamber 3 comprises a first heating mechanism and/or a second heating mechanism.

The first heating mechanism comprises a liquid or gas heater 14 and circulation device 15 (e.g., pump), a circulation conduit 10, a holder 11, and a holder table 4. The holder 11 is preferably made of a metal with good thermal conductivity, such as copper, aluminum, or stainless steel. The holder table 4 is situated on top of the holder 11 so that thermal conduction between the holder 11 and holder table 4 is enhanced.

Since the wafer 6 is set directly on the holder table 4, it is desirable to maximize the thermal conduction between the holder table 4 and the wafer 6. The rate of thermal conduction between two bodies is a function of, inter alia, the contact surface area, the contact pressure, the thermal conductivity of the materials in each body, and the temperature difference between the two bodies. It is also desirable that the contact surface 4a of the holder table 4 have a low electrical conductivity. Hence, the holder table 4 is preferably made of a ceramic with relatively high thermal conductivity and low electrical conductivity, such as SiC or BeO. The contact surface 4a is preferably planar and polished similarly to the planar bottom surface of the wafer 6, thereby maximizing the contact surface area. The contact surface 4a preferably has a thin metal film layer which is covered by a thin insulator layer to allow the holder table 4 to electrostatically hold the wafer 6 when a dc voltage is applied to the thin metal film layer, facilitating excellent thermal conduction.

The circulation conduit 10 extends through the holder 11. A temperature-controlled liquid or gas from a heater 14 is continually circulated by the circulation device 15 through the circulation conduit 10 to maintain the holder 11 (and thus the contact surface 4a) at a constant temperature. The temperature of the circulated liquid or gas is heated as required by the heater 14. The temperature of the holder table 4 is preferably set to approximately 25–26° C., which is 2–3° C. higher than the 23° C. interior temperature of the exposure-processing chamber 1. The precise temperature setting of the holder table 4 depends upon many factors, including the size of the load-lock chamber 3, the evacuation rate of the load-lock chamber 3, the wafer size and composition, the gas composition, etc. The temperature setting of the holder table 4 is adjusted to compensate for the temperature loss of the wafer 6 caused by adiabatic expansion of the load-lock chamber 3 during rapid evacuation so that the temperature of the wafer 6 upon entering the exposure-processing chamber 1 matches the interior temperature of the exposure-processing chamber 1.

A second heater 13 comprises a heating lamp or a nichrome heater. Infrared lamps and strobe flashes are desirable examples of heating lamps. Sheathed heaters, exposed heaters, and heaters embedded in metal plates are desirable examples of nichrome heaters.

Figure 3:
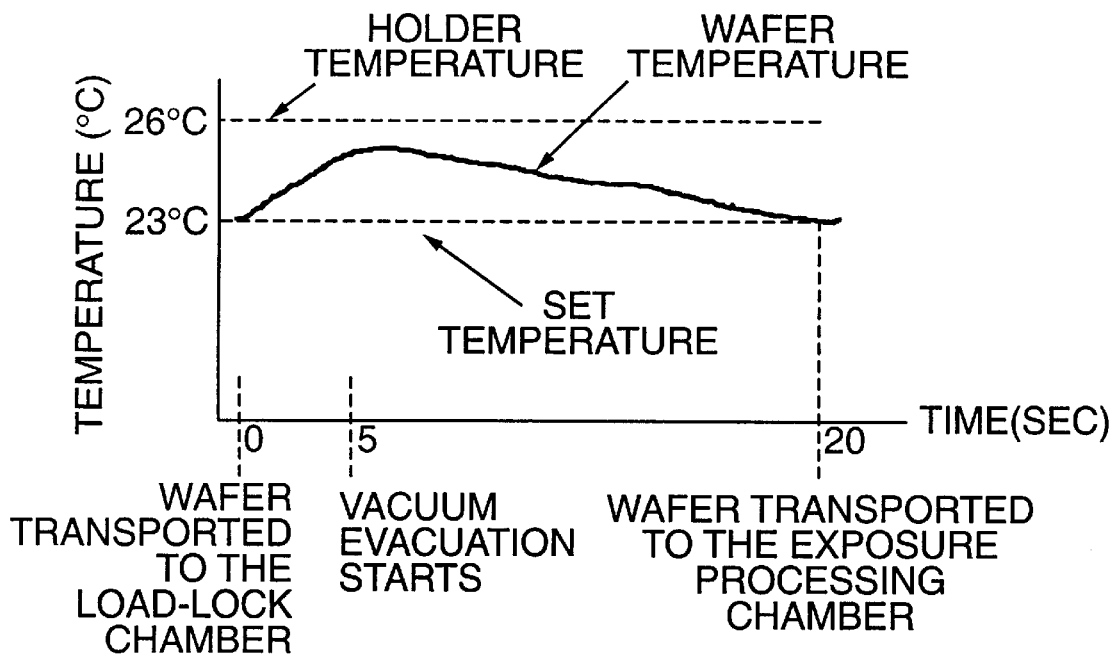
FIG. 3 is a wafer-temperature transition graph showing the temperature of a wafer during processing in the load-lock chamber.

FIG. 3 is a wafer-temperature transition graph showing the temperature of a wafer 6 during the time from the moment when the wafer 6 is transported into the load-lock chamber 3 to the moment the wafer is transported to the exposure-processing chamber 1. As shown in FIG. 3, the wafer temperature at the moment the wafer 6 enters the exposure-processing chamber 1 is substantially 23° C. (the preset temperature of the exposure-processing chamber 1). Therefore, temperature stabilization of the wafer 6 occurs almost instantly, and essentially no time is lost between transport of the wafer 6 into the exposure-processing chamber 1 and the start of exposure processing.

The CPB exposure apparatus of this example embodiment is preferably a "round-trip type" apparatus that returns processed wafers to be stored in the same atmospheric chamber in which they were stored before processing. Alternatively, the apparatus can be configured as a "one-way, in-line type" apparatus comprising a second load-lock chamber to which processed wafers are removed and a second atmospheric chamber in which the processed wafers are stored.

Example Embodiment 2

Figure 5:
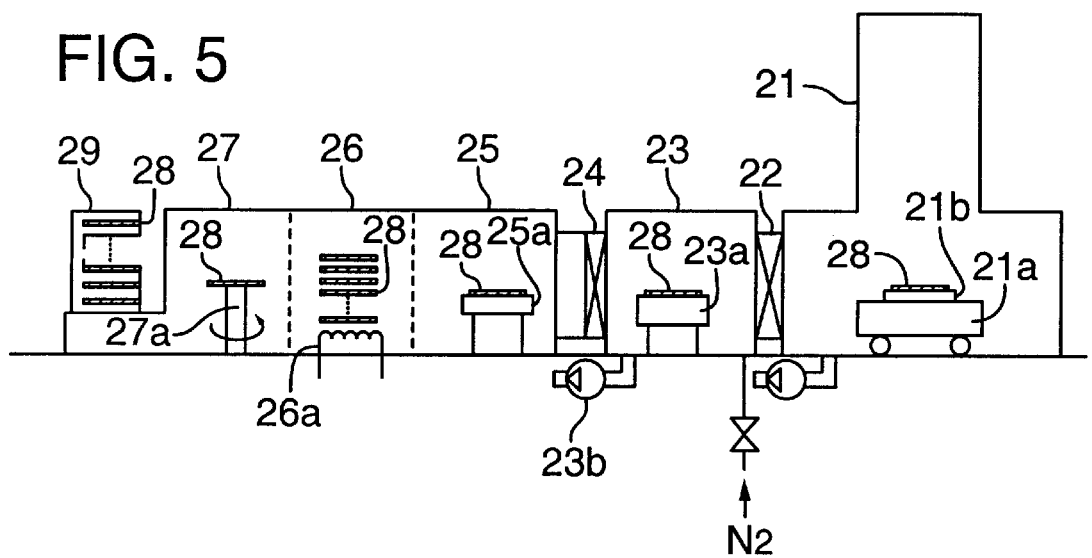
FIG. 5 is a schematic drawing showing an elevational view of a second example embodiment of a CPB exposure apparatus according to the invention.
Figure 6:
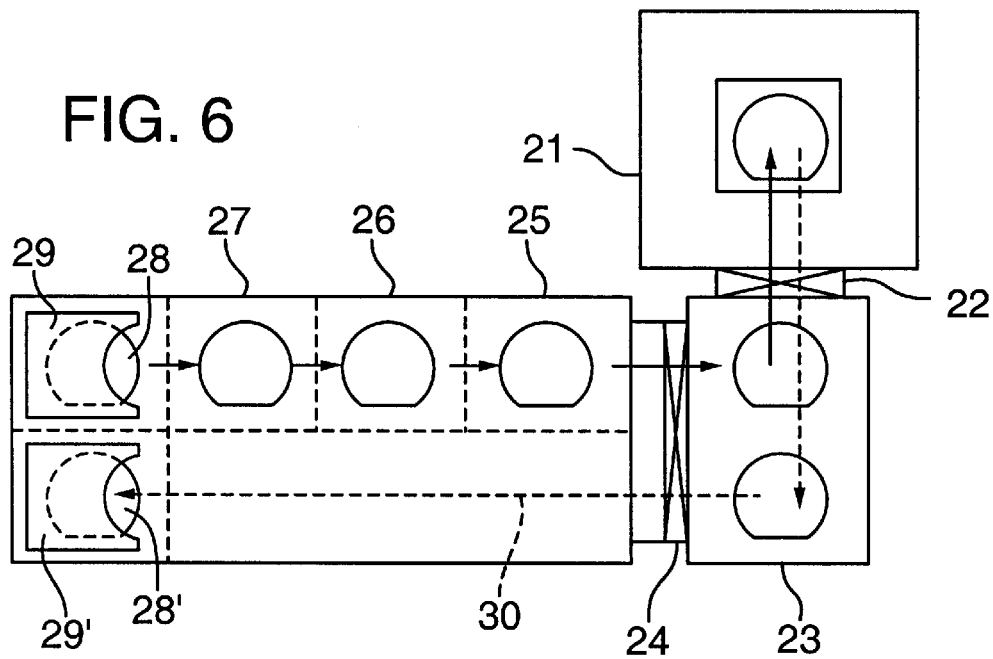
FIG. 6 is a plan-view drawing of the FIG. 5 embodiment.

FIG. 5 is a schematic drawing showing an elevational view of a CPB exposure apparatus according to this example embodiment. FIG. 6 is a plan-view drawing of the FIG. 5 apparatus.

The CPB exposure apparatus of this example embodiment comprises a wafer carrier 29, a coating chamber 27, a baking chamber 26, and a cooling chamber 25, sequentially connected. The cooling chamber 25 is connected to a load-lock chamber 23 by a first gate valve 24. The load-lock chamber 23 is connected to an exposure-processing chamber 21 by a second gate valve 22. Robot arms (not shown), which are preferably used to transport wafers, are situated between each of the chambers 21, 23, 25, 26, 27. The CPB exposure apparatus is preferably situated inside a temperature-controlled clean room. The chambers 21, 23, 25, 26, 27 are kept at a constant preset temperature by circulating a temperature-controlled liquid or other fluid through conduits around their exteriors.

Wafer carriers 29, 29' (FIG. 6) are moveable, multi-shelved racks that respectively hold multiple unexposed and exposed wafers 28, 28'. The unexposed wafers 28 are supplied from the wafer carrier 29 to be processed, while processed wafers 28' are stored in the wafer carrier 29'.

A spin coater 27a is situated inside the coating chamber 27. A wafer 28 is placed on the spin coater 27a and a resist applied to the wafer 28 while the wafer is spinning at several thousand rpm to form a resist film that is typically approximately 0.5 $\mu$m thick on the wafer 28.

A heater 26a is situated inside the baking chamber 26 to maintain the temperature in the chamber at 100° C. to 200° C. The wafer 28 is baked for a sufficient time inside the baking chamber 26 to evaporate the solvent in the resist. The baking temperature and duration are functions of the type of resist used and the type of exposure process required. The baking chamber 26 can be either a single-wafer or a batch-type baking chamber.

A cooling plate 25a, which cools the wafer 28, is situated inside the cooling chamber 25. The cooling plate 25a is temperature-controlled and preferably made of metal. The temperature of the cooling plate 25a can be controlled by liquid-cooling, Peltier heat-pump devices, or other equivalent cooling means. The wafer 28, which has come from the baking chamber 26, is placed on the cooling plate 25a and cooled to a specific preset temperature. The preset temperature is approximately 25–26° C., which is 2–3° C. higher than the 23° C. temperature of the exposure-processing chamber 21. The precise temperature setting of the cooling plate 25a depends upon many factors, including the size of the load-lock chamber 23, the evacuation rate of the load-lock chamber 23, the wafer size and composition, the thermal conductivity of the materials of which the load-lock chamber 23 is made, the gas composition, etc. The temperature setting can be adjusted to accurately compensate for the temperature loss of the wafer 28 caused by adiabatic expansion of the load-lock chamber 23 during rapid evacuation so that the wafer temperature, upon entry of the wafer into the exposure-processing chamber 21, matches the interior temperature of the exposure-processing chamber 21.

The wafer 28, after being cooled in the cooling chamber 25 to the desired temperature, is transported to the load-lock chamber 23 through the first gate valve 24, and placed on a pedestal 23a. The load-lock chamber 23 is at atmospheric pressure at this time. The first gate valve 24 is closed, and the load-lock chamber 23 is rapidly evacuated by a vacuum pump 23b. The desired vacuum level in the load-lock chamber 23 is preferably the same as the vacuum level inside of the exposure-processing chamber 21, which is constantly held at a high vacuum (e.g., $10^{-6}$ Torr). Rapid evacuation of the load-lock chamber 23 causes the wafer 28 to cool to about 23° C. due to adiabatic-expansion heat-transfer effects, as discussed above.

After evacuation of the load-lock chamber 23, the wafer 28 is transported from the load-lock chamber 23 to the exposure-processing chamber 21 through the second gate valve 22. The wafer 28 is secured to a wafer holder 21b on a wafer stage 21a. Exposure processing steps are then performed on the wafer 28 in the exposure-processing chamber 21.

Upon completion of the exposure processing steps, the second gate valve 22 opens and the exposed wafer 28 is returned to the load-lock chamber 23. After the gate valve 22 is closed, the load-lock chamber 23 is supplied with clean gas (e.g., $N_2$) to return the chamber to atmospheric pressure. As shown in FIG. 6, the wafer 28 is then transported to the wafer carrier 29 along an exit route 30, in which post-baking or development processing is performed as required.

FIG. 7 is a wafer-temperature transition graph that shows, with respect to this example embodiment, the temperature of the wafer 28 throughout the processing and transport operations prior to the start of exposure processing. During coating, the temperature of the wafer 28 is maintained at 23° C. The wafer temperature is then increased to approximately 100° C. during baking and subsequently cooled. At the moment evacuation of the load-lock chamber 23 begins, the wafer temperature is approximately 25–26° C. During the rapid evacuation of the load-lock chamber 23, the temperature of the wafer 28 decreases due to adiabatic-expansion heat-transfer effects, as indicated in the period between "evacuation start" and "exposure start." When the temperature of wafer 28 reaches the temperature in the exposure-processing chamber 21 (nominally 23° C.), the wafer 28 is transported into the exposure-processing chamber 21, whereupon exposure processing can immediately begin.

Example Embodiment 3

FIG. 8 is plan view block schematic diagram of a CPB exposure apparatus according to this example embodiment. An exposure-processing chamber 110, (understood to comprise an electron gun, an electron-beam projection-optical system, deflectors, a wafer stage on which a wafer W is placed for exposure, and interferometers that measure the XY coordinate position of the wafer stage, all not shown) is used for exposing the wafers W during semiconductor manufacturing operations. A loader chamber 120 is connected to the exposure-processing chamber 110 by a first gate valve G1. An load-lock chamber 130 is connected to the loader chamber 120 by a second gate valve G2. A third gate valve G3 is connected to the atmospheric side of the load-lock chamber 130. An isothermal tank 150 contains a wafer carrier 140 in which multiple wafers W can be stacked and stored. An isothermal gas-supply device 170 supplies temperature-controlled air or other suitable gas (via ducts 171, 172) to the interior of the isothermal tank 150. A robot arm 160 transports the wafers W between the isothermal tank 150 and the load-lock chamber 130. The load-lock chamber 130 is analogous to the load-lock chamber of Example Embodiments 1 and 2.

FIG. 9 is a schematic drawing showing further details of the isothermal tank 150. The isothermal tank 150 comprises a tank body 151, an elevator table 152 (on which the wafer carrier 140 is installed), and a door 153 for transporting the wafer carrier 140 into and out of the isothermal tank 150. An opening 151a in the tank body 151 allows the robot arm 160 to access the isothermal tank 150 and transport wafers between the wafer carrier 140 and the load-lock chamber 130. In addition, the isothermal tank 150 comprises an intake port 151b, for introducing temperature-controlled gas produced by the isothermal gas-supply device 170 into the upper portion of the tank body 151, and an exhaust port 151c for returning the gas to the isothermal air-supply device 170.

The isothermal gas-supply device 170 supplies the isothermal tank 150 with air or other suitable gas regulated at a specified temperature via the ducts 171, 172, as shown in FIG. 8. The regulated-temperature gas is supplied to the intake port 151b of the isothermal tank 150, producing a downward flow of regulated-temperature gas inside the isothermal tank 150 toward the exhaust port 151c. The wafers W stacked in the wafer carrier 140 are warmed by the regulated-temperature gas. The temperature of the gas is sufficient to maintain the temperature of the wafers W inside the isothermal tank 150 approximately 2–3° C. higher than the interior temperature of the exposure-processing chamber 10. The precise gas-temperature setting is adjusted to compensate for temperature losses imparted to the wafer W during its transport so that the temperature of the wafer W upon entering the exposure-processing chamber 110 matches the interior temperature of the exposure-processing chamber 110.

Transporting a wafer W through the CPB exposure apparatus of this example embodiment occurs as follows. The first and second gate valves G1, G2 are closed and the exposure-processing chamber 110 and loader chamber 120 are evacuated to a desired vacuum level. After the desired vacuum is reached, the third gate valve G3 is opened. The robot arm 160 removes a wafer W from the wafer carrier 140, and transports the wafer W into the load-lock chamber 130. The third gate valve G3 is then closed and the load-lock chamber 130 is rapidly evacuated to match the vacuum inside the loading chamber 120 and the exposure-processing chamber 110. The gate second valve G2 is then opened, whereupon the wafer W is transported into the loader chamber 120, and the second gate valve G2 is closed. The first gate valve G1 is opened and the wafer W is transported from the loader chamber 120 onto a wafer stage in the exposure-processing chamber 110.

During the foregoing transport steps, the temperature of the wafer W decreases. Most of the temperature decrease occurs during rapid evacuation of the load-lock chamber 130; such adiabatic-expansion heat-transfer effects cause a wafer temperature drop of approximately 2–3° C. Such a temperature decrease can be compensated for by heating the wafer W in the isothermal tank 150 so that the temperature of the wafer W upon entering the exposure-processing chamber 110 matches the interior temperature of the exposure-processing chamber 110.

In the discussion above, the isothermal tank 150 is preferably heated with circulated air or other suitable gas. However, alternative methods can be employed to maintain a constant-temperature condition in the isothermal tank 150. For instance, a heater can be installed inside the isothermal tank 150, or temperature-controlled liquid can be circulated through conduits in the isothermal tank 150.

Example Embodiment 4

Details of the CPB exposure apparatus of this example embodiment are shown in FIGS. 10 and 11. FIG. 10 shows several components with the same reference designators as corresponding components shown in FIG. 8. Such similar components are not discussed further below.

A wafer W is transported to a top surface (such as a conveyor belt) of a transport device 180. An isothermal plate 190 is arranged at a terminus of the transport device 180. The wafer W is transported by the transport device 180 to the isothermal plate 190. As shown in FIG. 11, the isothermal plate 190 comprises conduits 191 through which isothermal liquid (e.g., water) flows to control the temperature of the isothermal plate 190. An isothermal liquid supply 100 supplies temperature-controlled liquid to the conduits 191 via conduits 101, 102. The temperature of the liquid is regulated so that the temperature of the isothermal plate (and thus of the wafer W) is maintained at approximately 2–3° C. higher than the interior temperature of the exposure-processing chamber 110, as described above. As in Example Embodiment 3, the precise temperature setting of the isothermal plate 190 is adjusted to compensate for temperature losses imparted to the wafer W during its transport so that the temperature of the wafer W upon entering the exposure-processing chamber 110 matches the interior temperature of exposure-processing chamber 110.

The wafer W is subsequently transported into the exposure-processing chamber 110 through a series of steps similar to those described above in Example Embodiment 3, except that, in Example Embodiment 4, the robot arm 160 removes the wafer W from the isothermal plate 190 rather than from the wafer carrier 140 (as occurs in Example Embodiment 3).

In Example Embodiments 3 and 4, a loader chamber 120 is situated between the load-lock chamber 130 and the exposure-processing chamber 110. The loader chamber 120 can be omitted, if desired. Furthermore, in Example Embodiment 4, isothermal water is preferably used to control the temperature of an isothermal plate. Alternatively, another fluid with appropriate heat-transfer properties can be used.

Whereas the present invention has been described in connection with preferred embodiments, it will be understood that the invention is not limited to those embodiments. On the contrary, the invention is intended to cover all alternatives, modifications, and equivalents as may be included within the spirit and scope of the invention as defined in the appended claims.

What is claimed is:

1. A charged-particle-beam exposure apparatus, comprising:
   (a) an exposure-processing chamber in which exposure of a sensitive substrate is performed using a charged-particle beam under preset vacuum and exposure-temperature conditions;
   (b) a load-lock chamber having an interior pressure that is variable between an atmospheric pressure and a subatmospheric pressure;
   (c) a gate valve connecting the load-lock chamber to the exposure-processing chamber;
   (d) transport means for transporting the sensitive substrate from an external environment into the load-lock chamber, and for transporting the sensitive substrate between the load-lock chamber and the exposure-processing chamber; and
   (e) temperature-adjusting means for adjusting the temperature of the sensitive substrate prior to exposure-processing of the sensitive substrate in the exposure-processing chamber, the sensitive substrate being transported into the load-lock chamber under atmospheric conditions, after which the load-lock chamber is evacuated to a vacuum condition to allow the sensitive substrate to be transported from the evacuated load-lock chamber through the gate valve into the exposure-processing chamber, said temperature-adjusting means adjusting the temperature of the sensitive substrate such that, when the sensitive substrate is transported into the exposure-processing chamber, the sensitive substrate is at the exposure temperature.

2. The charged-particle-beam exposure apparatus of claim 1, wherein said temperature-adjusting means maintains the sensitive substrate at a temperature that compensates for heat loss to the sensitive substrate due to adiabatic expansion and other heat losses occurring as the sensitive substrate is transported from the exterior environment to inside the exposure-processing chamber.

3. The charged-particle-beam exposure apparatus of claim 1, wherein said temperature-adjusting means is situated inside the load-lock chamber.

4. The charged-particle-beam exposure apparatus of claim 3, wherein said temperature-adjusting means comprises a sensitive-substrate holder comprising a conduit through which a temperature-controlled liquid or gas is circulated.

5. The charged-particle-beam exposure apparatus of claim 4, wherein the sensitive-substrate holder comprises a ceramic material having a planar top surface, the top surface comprising a thin metal film layer with a thin insulator layer thereon, a dc voltage being applied to the thin metal film layer to electrostatically secure the sensitive substrate to the top surface.

6. The charged-particle-beam exposure apparatus of claim 3, wherein said temperature-adjusting means comprises a thermally conductive sensitive-substrate holder and a heater for heating the sensitive-substrate holder.

7. The charged-particle-beam exposure apparatus of claim 6, wherein the heater is a heating lamp or nichrome heater.

8. The charged-particle-beam exposure apparatus of claim 3, wherein said temperature-adjusting means comprises a thermally conductive sensitive-substrate holder, a conduit through which a temperature-controlled liquid or gas is circulated, and a heater for heating the sensitive-substrate holder.

9. The charged-particle-beam exposure apparatus of claim 1, further comprising a coater for applying a resist to the sensitive substrate, a baking chamber in which the sensitive substrate is baked at a baking temperature after the resist is applied, a cooling chamber in which the sensitive substrate is cooled after baking, and transport means for transporting the sensitive substrate from the coater to the baking chamber, from the baking chamber to the cooling chamber, and from the cooling chamber to the load-lock chamber, and wherein said temperature-adjusting means is situated in the cooling chamber.

10. The charged-particle-beam exposure apparatus of claim 9, wherein said temperature-adjusting cooling means comprises a temperature-controlled metal plate on which the sensitive substrate is placed to adjust the temperature of the sensitive substrate.

11. The charged-particle-beam exposure apparatus of claim 1, wherein said temperature-adjusting means comprises an isothermal tank containing a gas controlled to a preset temperature, wherein said transport means transports the sensitive substrate stored in the isothermal tank into the load-lock chamber.

12. The charged-particle-beam exposure apparatus of claim 1, wherein said temperature-adjusting means comprises an isothermal plate, wherein said transport means transports the sensitive substrates from the isothermal plate into the load-lock chamber.

13. A charged-particle-beam exposure apparatus, comprising:
   (a) an exposure-processing chamber in which exposure of a sensitive substrates is performed using a charged-particle beam under preset vacuum and exposure-temperature conditions;
   (b) a load-lock chamber in which pressure is variable between atmospheric and subatmospheric;
   (c) a loader chamber in which temperature is controlled;
   (d) a first gate valve connecting the load-lock chamber to the loader chamber;
   (e) a second gate valve connecting the loader chamber to the exposure-processing chamber;
   (f) transport means for transporting the sensitive substrate between an external environment and the load-lock chamber, for transporting the sensitive substrate from the load-lock chamber and the loader chamber, and for transporting the sensitive substrates from the loader chamber to the exposure-processing chamber; and
   (g) temperature-adjusting means for controllably adjusting the temperature of the sensitive substrate prior to exposure processing of the sensitive substrate in the exposure-processing chamber, wherein the sensitive substrate is transported from the external environment to the exposure-processing chamber by a sequence comprising transport of the sensitive substrate into the load-lock chamber under atmospheric conditions, evacuation of the load-lock chamber to a vacuum condition, transport of the sensitive substrate from the load-lock chamber through the first gate valve into the loader chamber, and transport of the sensitive substrate from the loader chamber through the second gate valve into the exposure-processing chamber, said temperature-adjusting means adjusting the temperature of the sensitive substrate such that, when the sensitive substrate is transported into the exposure-processing chamber, the sensitive substrate is at the exposure temperature.

14. A method for increasing the throughput of a charged-particle-beam exposure apparatus, wherein exposure of a sensitive substrate by a charged-particle beam occurs in an exposure-processing chamber under preset vacuum and temperature conditions, the method comprising the steps:
   (a) transporting a sensitive substrate into a load-lock chamber under atmospheric conditions;
   (b) evacuating the load-lock chamber to a preset vacuum level to match a vacuum level in the exposure-processing chamber;
   (c) transporting the sensitive substrate from the evacuated load-lock chamber into the exposure-processing chamber; and
   (d) adjusting the temperature of the sensitive substrate so as to compensate for any temperature loss to the sensitive substrate during steps (a)–(c) so that the temperature of the sensitive substrate upon entering the exposure-processing chamber matches an interior temperature of the exposure-processing chamber.

15. A method for increasing the throughput of a charged-particle-beam exposure apparatus, wherein exposure of a sensitive substrate by a charged-particle beam occurs in an exposure-processing chamber under preset vacuum and temperature conditions, the method comprising the steps:
   (a) transporting a sensitive substrate into a load-lock chamber under atmospheric conditions;
   (b) evacuating the load-lock chamber to a preset vacuum level to match a vacuum level in the exposure-processing chamber;
   (c) transporting the sensitive substrate from the load-lock chamber into a loader chamber;
   (d) transporting the sensitive substrate from the loader chamber into the exposure-processing chamber; and
   (e) adjusting the temperature of the sensitive substrate so as to compensate for any temperature loss to the sensitive substrate during steps (a)–(d) so that the temperature of the sensitive substrate upon entering the exposure-processing chamber matches an interior temperature of the exposure-processing chamber.

* * * * *

UNITED STATES PATENT AND TRADEMARK OFFICE
CERTIFICATE OF CORRECTION

PATENT NO.   : 5,914,493

DATED        : June 22, 1999

INVENTOR(S)  : Morita et al.

It is certified that error appears in the above-identified patent and that said Letters Patent is hereby corrected as shown below:

<u>In the Specification:</u>

Column 4, line 34, "load-lock chamber 2" should be --load-lock chamber 3--.

Column 8, line 29, "chamber 10" should be --chamber 110--.

<u>In the Claims:</u>

Column 11, line 13, claim 13, "substrates" should be --substrate--.

Signed and Sealed this

Eighth Day of February, 2000

Attest:

*Attesting Officer*

Q. TODD DICKINSON
*Commissioner of Patents and Trademarks*